United States Patent
Doi et al.

(10) Patent No.: US 8,601,329 B2
(45) Date of Patent: Dec. 3, 2013

(54) TEST APPARATUS AND TEST METHOD

(75) Inventors: Masaru Doi, Saitama (JP); Kazuhiro Shibano, Gunma (JP)

(73) Assignee: Advantest Corporation, Tokyo (JP)

(*) Notice: Subject to any disclaimer, the term of this patent is extended or adjusted under 35 U.S.C. 154(b) by 224 days.

(21) Appl. No.: 12/975,296

(22) Filed: Dec. 21, 2010

(65) Prior Publication Data

US 2011/0258491 A1  Oct. 20, 2011

Related U.S. Application Data

(63) Continuation of application No. PCT/JP2008/063537, filed on Jul. 28, 2008.

(51) Int. Cl.
*G11C 29/00* (2006.01)

(52) U.S. Cl.
USPC .......................... 714/718; 714/711

(58) Field of Classification Search
USPC .......................... 714/711, 718, 723; 365/201
See application file for complete search history.

(56) References Cited

U.S. PATENT DOCUMENTS

| | | | | |
|---|---|---|---|---|
| 5,790,559 A * | 8/1998 | Sato | ............................. | 714/720 |
| 5,946,250 A | 8/1999 | Suzuki | | |
| 5,987,627 A * | 11/1999 | Rawlings, III | .................. | 714/48 |
| 6,115,833 A | 9/2000 | Sato et al. | | |
| 6,173,238 B1 * | 1/2001 | Fujisaki | ......................... | 702/117 |
| 6,536,005 B1 * | 3/2003 | Augarten | ....................... | 714/723 |
| 7,240,256 B2 * | 7/2007 | Yamane | ......................... | 714/723 |
| 7,757,134 B2 * | 7/2010 | Kobayashi | .................... | 714/719 |
| 2005/0043912 A1 | 2/2005 | Kang et al. | | |
| 2007/0208969 A1 | 9/2007 | Fujisaki | | |

FOREIGN PATENT DOCUMENTS

| | | |
|---|---|---|
| JP | 09-269358 A | 10/1997 |
| JP | 10-269799 A | 10/1998 |
| JP | 11-238395 A | 8/1999 |
| JP | H11-213695 A | 8/1999 |
| JP | 2003-132696 A | 5/2003 |
| JP | 2004-348892 A | 12/2004 |
| JP | 2005-267673 A | 9/2005 |
| JP | 2007-157264 A | 6/2007 |

(Continued)

OTHER PUBLICATIONS

Pettersson, A.; Sundmark, D.; Thane, H.; Nystrom, D.; , "Shared Data Analysis for Multi-Tasking Real-Time System Testing," Industrial Embedded Systems, 2007. SIES '07. International Symposium on , vol., No., pp. 110-117, Jul. 4-6, 2007.*

(Continued)

*Primary Examiner* — Cynthia Britt

(57) ABSTRACT

A test apparatus includes: a test executing section executing a test on the device under test; a fail memory storing a test result outputted by the test executing section, the fail memory implementing an interleave technology for interleaving accesses to a plurality of banks; a buffer memory storing the test result transferred from the fail memory and transfers at least part of the test result to a cache memory, the buffer memory being either a memory not implementing the interleave technology or a memory implementing the interleave technology but having a smaller number of banks than the fail memory; the cache memory storing the at least part of the test result transferred from the buffer memory, the cache memory allowing random access in shorter time than the buffer memory does; and an analysis section analyzing the test result stored in the cache memory.

7 Claims, 7 Drawing Sheets

(56) References Cited

FOREIGN PATENT DOCUMENTS

| | | |
|---|---|---|
| JP | 2007-257684 A | 10/2007 |
| JP | 2008-059688 A | 3/2008 |
| JP | 2008-192227 A | 8/2008 |
| TW | 200828331 | 7/2008 |
| WO | 2005088645 | 9/2005 |

OTHER PUBLICATIONS

Reviriego, P.; Maestro, J.A.; Cervantes, C.; , "Reliability Analysis of Memories Suffering Multiple Bit Upsets," Device and Materials Reliability, IEEE Transactions on , vol. 7, No. 4, pp. 592-601, Dec. 2007.*

Korean Office Action dated Mar. 20, 2012, in a counterpart Korean patent application 10-2010-7027078.

International Search Report (ISR) issued in PCT/JP2008/063537 (parent application) mailed in Oct. 2008 for Examiner consideration.

Written Opinion (PCT/ISA/237) issued in PCT/JP2008/063537 (parent application) mailed in Oct. 2008.

JP Office Action/ Search Report and Machine Translation Dated Sep. 18, 2012; Application No. 2010-522542.

TW Office Action/ Search Report and English Translation Dated Aug. 20, 2013; Application No. 098125233.

\* cited by examiner

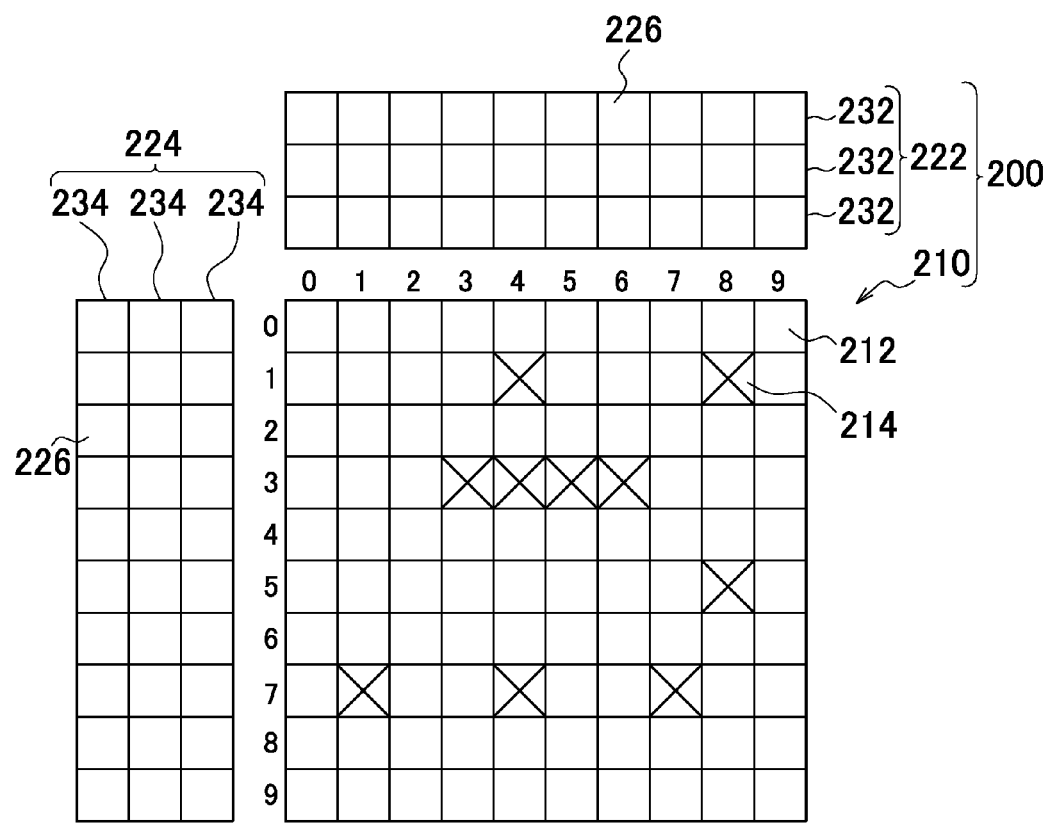
F I G . 2

TEST APPARATUS AND TEST METHOD

BACKGROUND

1. Technical Field

The present invention relates to a test apparatus and a test method.

2. Related Art

Representative test apparatuses for testing a device under test such as a DRAM include a semiconductor test apparatus. For example, Patent Document No. 1 discloses a semiconductor memory test apparatus used for memory repair in a semiconductor memory IC. The semiconductor memory test apparatus described in Patent Document No. 1 stores a test result in the address fail memory while the test continues. After ending of the test, the semiconductor memory test apparatus transfers the test result to the fail buffer memory, to execute the pass/fail analysis. After ending of the transfer of the test result, the next test is started (see Patent Document No. 1). Patent Document No. 2 and Patent Document No. 3 disclose similar technologies.

Patent Document No. 1: Japanese Patent Application Publication No. H11-213695
Patent Document No. 2: Japanese Patent Application Publication No. 2005-267673
Patent Document No. 3: Japanese Patent Application Publication No. 2004-348892

However as the capacity of semiconductor devices increases, transfer of the fail data takes longer, affecting the test throughput. In view of the large ratio of the test cost in the production cost of device under tests, further improvement in test throughput is desirable.

SUMMARY

Therefore, it is an object of an aspect of the innovations herein to provide a reception apparatus, a test apparatus, a reception method, and a test method, which are capable of overcoming the above drawbacks accompanying the related art. The above and other objects can be achieved by combinations described in the independent claims. The dependent claims define further advantageous and exemplary combinations of the innovations herein.

An exemplary apparatus related to the innovations included herein is a test apparatus for testing a device under test, including: a test executing section that executes a test on the device under test; a fail memory that stores a test result outputted by the test executing section, the fail memory implementing an interleave technology for interleaving accesses to a plurality of banks; a buffer memory that stores the test result transferred from the fail memory and transfers at least part of the test result to a cache memory, the buffer memory being either a memory not implementing the interleave technology or a memory implementing the interleave technology but having a smaller number of banks than the fail memory; the cache memory that stores the at least part of the test result transferred from the buffer memory, the cache memory allowing random access in shorter time than the buffer memory does; and an analysis section that analyzes the test result stored in the cache memory.

An exemplary method related to the innovations herein is a test method of a device under test, the test method including: sequentially repeating test cycles each composed of: data inputting, which involves inputting test data to the device under test; test storing, which involves testing the device under test based on an output from the device under test and storing a test result to a fail memory; transferring, which involves transferring the test result stored in the fail memory to a buffer memory, and analyzing, which involves analyzing the test result stored in the buffer memory, where after ending of the data inputting and the test storing of one test cycle, a next test cycle is started, and the data inputting and the test storing for the next test cycle are multiplexed with the transferring and the analyzing of the one test cycle.

The summary clause does not necessarily describe all necessary features of the embodiments of the present invention. The present invention may also be a sub-combination of the features described above.

BRIEF DESCRIPTION OF THE DRAWINGS

FIG. 2 schematically shows an exemplary configuration of a device under test 10.

DESCRIPTION OF EXEMPLARY EMBODIMENTS

Figure 1:
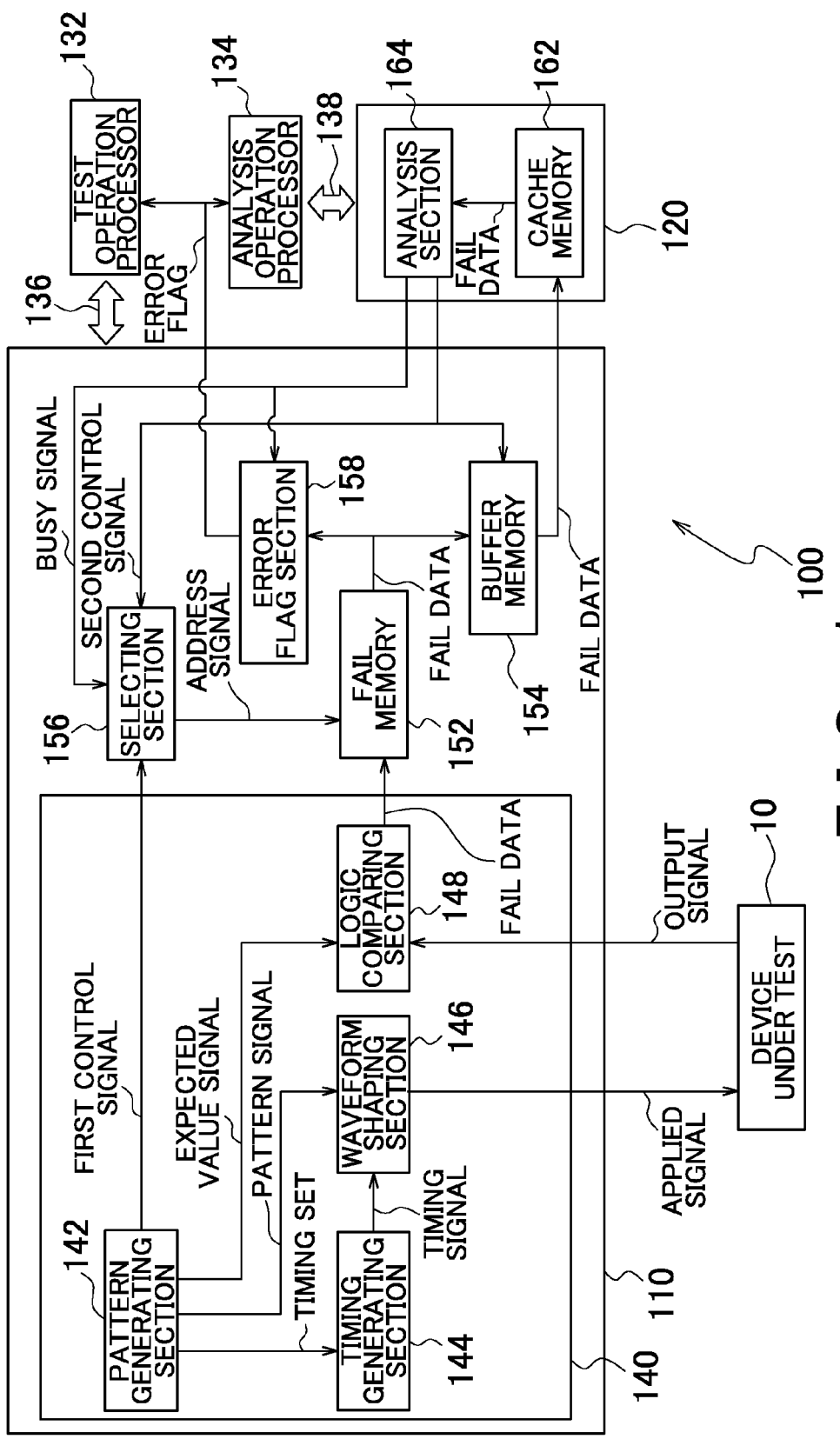
FIG. 1 schematically shows an exemplary configuration of a test apparatus 100 according to an embodiment of the present invention.

Hereinafter, some embodiments of the present invention will be described. The embodiments do not limit the invention according to the claims, and all the combinations of the features described in the embodiments are not necessarily essential to means provided by aspects of the invention.

In the drawings, the same or similar members are occasionally assigned the same reference numeral, and the redundant explanation may be omitted in the following.

FIG. 1 schematically shows an exemplary configuration of a test apparatus 100 according to an embodiment of the present invention. The test apparatus 100 tests the device under test 10. The test apparatus 100 may test the device under test 10 and analyze thus obtained test result, to perform memory repair analysis of the device under test 10. The test apparatus 100 includes a memory repair test section 110, a memory repair analysis section 120, a test operation processer 132, and an analysis operation processor 134.

After writing an applied signal to the device under test 10, the memory repair test section 110 reads an output signal outputted from the device under test 10, to obtain the test result of the device under test 10. The memory repair test section 110 includes a test executing section 140, a fail memory 152, a buffer memory 154, a selecting section 156, and an error flag section 158.

The test executing section 140 executes a test on the device under test 10. The test executing section 140 includes a pattern generating section 142, a timing generating section 144, a waveform shaping section 146, and a logic comparing section 148.

The pattern generating section 142 generates a pattern signal and supplies the pattern signal to the waveform shaping section 146. The pattern signal defines the data pattern to be applied to the device under test 10. The pattern generating section 142 generates a timing set, and supplies the timing set to the timing generating section 144. The timing set defines the timing edge of the pattern signal. The pattern generating section 142 generates an expected value signal, and supplies the expected value signal to the logic comparing section 148. The expected value signal defines the pattern that the device under test should output according to the pattern signal and the timing set. The pattern generating section 142 generates a first control signal, and supplies the first control signal to the selecting section 156. The first control signal controls storage of a test result to the fail memory 152. The first control signal may define the address at which the test result should be stored.

The timing generating section 144 generates a reference clock. The timing generating section 144 may generate a timing signal according to the generated reference clock and to the timing set supplied from the pattern generating section 142, and supply the generated timing signal to the waveform shaping section 146. The waveform shaping section 146 shapes the pattern signal supplied from the pattern generating section 142 and the timing signal supplied from the timing generating section 144, into a waveform suitable for the test of the device under test 10. The waveform shaping section 146 applies the shaped waveform to the device under test 10.

The logic comparing section 148 reads the output signal that the device under test 10 has outputted in response to the applied signal. The logic comparing section 148 compares the read output signal to the expected value signal supplied from the pattern generating section 142. When the output signal does not match the expected value signal, the logic comparing section 148 outputs fail data and supplies it to the fail memory 152. The fail data may be an example of the test result.

The fail memory 152 stores a test result outputted from the test executing section 140. The fail memory 152 may store the test result, in association with various types of signals generated by the pattern generating section 142. In the present embodiment, the fail memory 152 stores the fail data supplied from the logic comparing section 148, at the address designated by the address signal supplied from the selecting section 156. The fail memory 152 may implement an interleave technology for interleaving the accesses to the plurality of banks.

The test result is transferred from the fail memory 152 to the buffer memory 154. The buffer memory 154 stores thus received test result. The buffer memory 154 may not implement the interleave technology. In this case, the test result from the fail memory 152 may be burst transferred to the buffer memory 154. Alternatively, the buffer memory 154 may implement the interleave technology, while including a smaller number of banks than the fail memory 152. According to the stated configuration, the circuitry size of the buffer memory can be made smaller than the size of the memory implementing the interleave technology.

The selecting section 156 selects, as an address signal, either the first control signal supplied from the pattern generating section 142 or the second control signal supplied from an analysis section 164. The selecting section 156 supplies thus selected address signal to the fail memory 152. The second control signal controls the transfer of the test result from the fail memory 152 to the buffer memory 154. The second control signal may define the address in which fail data is to be stored, when the fail data stored in the fail memory 152 is transferred to the buffer memory 154.

In the present embodiment, the selecting section 156 is controlled by a busy signal supplied from the memory repair analysis section 120. The busy signal indicates that the test result is being transferred from the fail memory 152 to the buffer memory 154. Therefore, when provided with a busy signal, the selecting section 156 should select the second control signal as the address signal. When not supplied with the busy signal, the selecting section 156 selects the first control signal as the address signal.

During the transfer of the test result from the fail memory 152 to the buffer memory 154, if transmission of a new test result from the fail memory 152 to the buffer memory 154 has occurred, the error flag section 158 generates an error flag and stores it. The error flag may be an example of data indicating that a new test result has been transmitted. For example, the error flag section 158 may generate an error flag, if the fail data is supplied to the error flag section 158 from the fail memory 152 and if the busy signal is supplied to the error flag section 158 from the memory repair analysis section 120.

During the transfer of the test result from the fail memory 152 to the buffer memory 154, if transmission of a new test result from the logic comparing section 148 to the fail memory 152 has occurred, the error flag section 158 may store the new test result. Although the present embodiment relates to a case in which the error flag section 158 generates an error flag, the generation of an error flag is not limited to this. For example, the error flag may be generated by the logic comparing section 148, and supplied to the error flag section 158.

The data stored in the error flag section 158 may be read by the test operation processor 132 or the analysis operation processor 134 after ending of the test. The data may also be supplied to the test operation processor 132 as a interrupt signal. Receiving the error flag, the test operation processor 132 may end the test.

The memory repair analysis section 120 may analyze the test result, to perform memory repair analysis (hereinafter occasionally referred to as "MRA") of the device under test 10. The function of the memory repair analysis section 120 may be realized partly by hardware and partly by software. The memory repair analysis can thus be performed by a combination of hardware and software. Accordingly, while a part of the memory repair analysis is performed by the software, the hardware can start executing memory repair analysis of the next test result.

The memory repair analysis section 120 may include a cache memory 162 and an analysis section 164. At least a part of the test result stored in the buffer memory is transferred to the cache memory 162. The cache memory 162 stores therein thus received test result. The cache memory 162 may be a memory that allows random access in shorter time than the buffer memory 154. SDRAM is an example of the cache memory 162. Consequently, even if random access to the buffer memory 154 takes longer, the analysis thereof can be performed in high speed.

The analysis section 164 analyzes the test result stored in the cache memory 162. Although the function of the analysis section 164 is realized by hardware in the present embodiment, the present invention is not limited to this. The function of the analysis section 164 may alternatively be realized by software.

The test operation processor 132 controls the memory repair test section 110 via a tester bus 136. The analysis operation processor 134 controls the memory repair analysis section 120. The analysis operation processor 134 may control the memory repair analysis section 120 via a dedicated bus 138. The analysis operation processor 134 may execute a part of the analysis by means of software.

FIG. 2 schematically shows an exemplary configuration of a device under test 10. The device under test 10 may be a memory device such as DRAM. As shown in FIG. 2, the device under test 10 in the present embodiment includes a memory block 200. The device under test 10 may include a plurality of memory blocks 200. A memory block 200 may include a memory cell array 210, a redundant section 222, and a redundant section 224.

The memory cell array 210 includes a plurality of memory cells 212. A part of the plurality of memory cells 212 may be failure memory cell(s) 214. The failure memory cell(s) 214 may be detected by the test executed by the test executing section 140. A failure memory cell 214 may be an example of a failure section of a device under test 10 failing the test executed by the test executing section 140.

Each of the redundant section 222 and the redundant section 224 includes a plurality of redundant memory cells 226. The redundant section 222 may include a plurality of row repair lines 232. Each row repair line 232 may be formed by redundant memory cells 226 arranged in the row direction (right and left directions of the drawing) of the memory cell array 210 Each row repair line 232 may include memory cells in the same number as a row line of the memory cell array 210. The redundant section 224 may include a plurality of column repair lines 234. Each column repair line 234 is formed by redundant memory cells 226 arranged in the column direction (upper and lower directions of the drawing) of the memory cell array 210. Each column repair line 234 may include memory cells in the same number as a column line of the memory cell array 210. The row repair lines 232 and the column repair lines 234 may be an example of the redundant rows and the redundant columns.

The device under test 10 includes an enormous number of memory cells 212, and so often includes failure memory cells 214. A device under test 10, including a failure memory cell 214, can be repaired by replacing the failure memory cell 214 with a redundant memory cell 226. The replacement is referred to as "memory repair."

The memory repair may be executed by switching the address code. For example, the address code switch may be performed so that access to the failure column including the failure memory cell 214, from among the column lines of the memory cell array 210, be prohibited, to be able to access the column repair line 234 instead. The memory repair of the failure column including the failure memory cell 214 may also be performed in the similar manner to the memory repair of the failure row. The address code switch may be performed by a fuse blow method or a laser repair method, for example.

Since the number of redundant memory cells 226, row repair lines 232, and column repair lines 234 is limited, the device under test 10 including failure memory cells 214 cannot be repaired unless the replacement of the failure memory cells 214 is performed efficiently. The replacement method is determined by the memory repair analysis. The analysis section 164 may determine a repair method for replacing the failure section included in the memory cell array 210 with the redundant section 222 or the redundant section 224.

Figure 3:
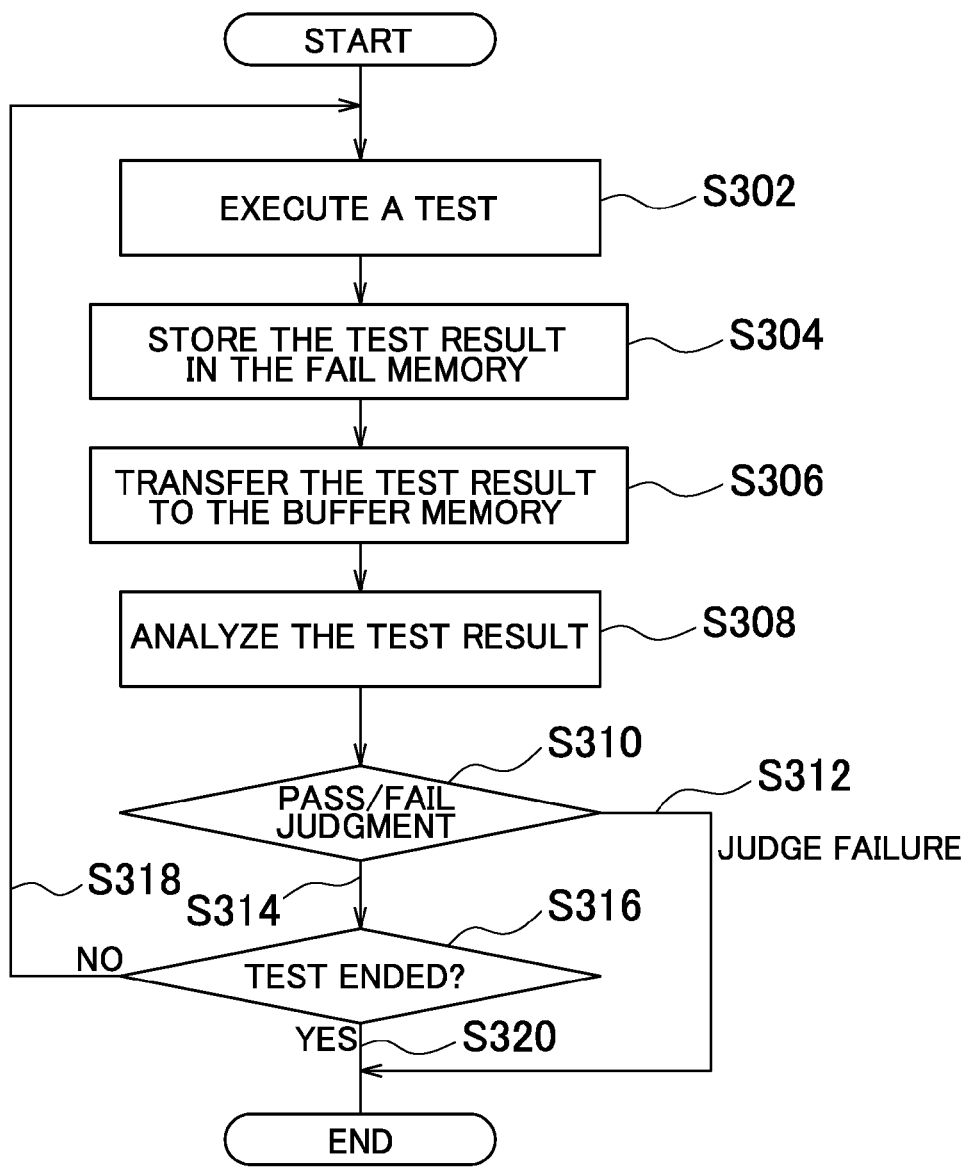
FIG. 3 schematically shows an exemplary test method adopted by the test apparatus 100.

FIG. 3 schematically shows an exemplary test method adopted by the test apparatus 100. The test apparatus 100 executes the memory repair analysis in the following sequence. In S302, the memory repair test section 110 executes a test on the device under test 10, and obtains a test result. In S304, the memory repair test section 110 stores the obtained test result in the fail memory 152. In S306, the memory repair test section 110 transfers the test result from the fail memory 152 to the buffer memory 154.

Next, in S308, the memory repair analysis section 120 analyzes the test result. In the present embodiment, the analysis of the test result is pursued in the following sequence. First, the memory repair analysis section 120 may read at least a part of the fail data transferred to the buffer memory 154, and transfers the read fail data to the cache memory 162. While reading the fail data from the cache memory 162, the analysis section 164 counts the number of failure memory cells for each column line, the number of failure memory cells for each row line, and the number of failure memory cells included in the memory block.

The analysis section 164 calculates the number of row lines that need to be replaced with the row repair lines 232, from among the row lines included in the memory cell array, based on the above-mentioned various counts, the number of row repair lines 232 and the number of column repair lines 234. Likewise, the analysis section 164 calculates the number of column lines that need to be replaced with the column repair lines 234, from among the column lines included in the memory cell arrays. Next, the analysis section 164 obtains the addresses of the failure memory cells 214 not repaired even by the above-explained replacement of row lines and column lines.

Based on the above-mentioned various counts and the addresses of the failure memory cells 214, the analysis operation processor 134 uses software to determine a method for replacing the failure rows or failure columns including failure memory cell(s) 214 with the optimal row repair lines 232 and column repair lines 234. Although the optimal replacement method is determined by the analysis operation processor 134 in the present embodiment, the present invention is not limited to this. For example, the optimal replacement method may be determined by the analysis section 164.

Next in S310, the pass/fail of the device under test 10 is judged. The pass/fail of the device under test 10 is judged by referring to whether all the failure memory cells 214 have been repaired or not. If a part of the failure memory cells 214 has left unrepaired (S312 of FIG. 3) even after the memory repair analysis, the device under test 10 is judged to fail the test, and the test ends. On the other hand, if all the failure memory cells 214 have been repaired by the memory repair analysis (S314 of FIG. 3), the device under test 10 is judged to pass the test, and the process proceeds to S316.

In S316, it is judged whether to end the test. For example, it is judged whether the test has been performed for all the test conditions. Various test conditions for testing a device under test are set in MRA. These test conditions may become more strict as the repetition of the test. Steps from S302 through S316 are repeated sequentially, until the test is performed for all the test conditions (S318 of FIG. 3). When it is judged that the test has finished for all the test conditions in S316 (S320 of FIG. 3), the test by the test apparatus 100 ends.

After the test apparatus 100 has ended the test, the address code may be switched based on the result of the memory repair analysis. After switching the address code, the device under test 10 may be tested again.

Figure 4:
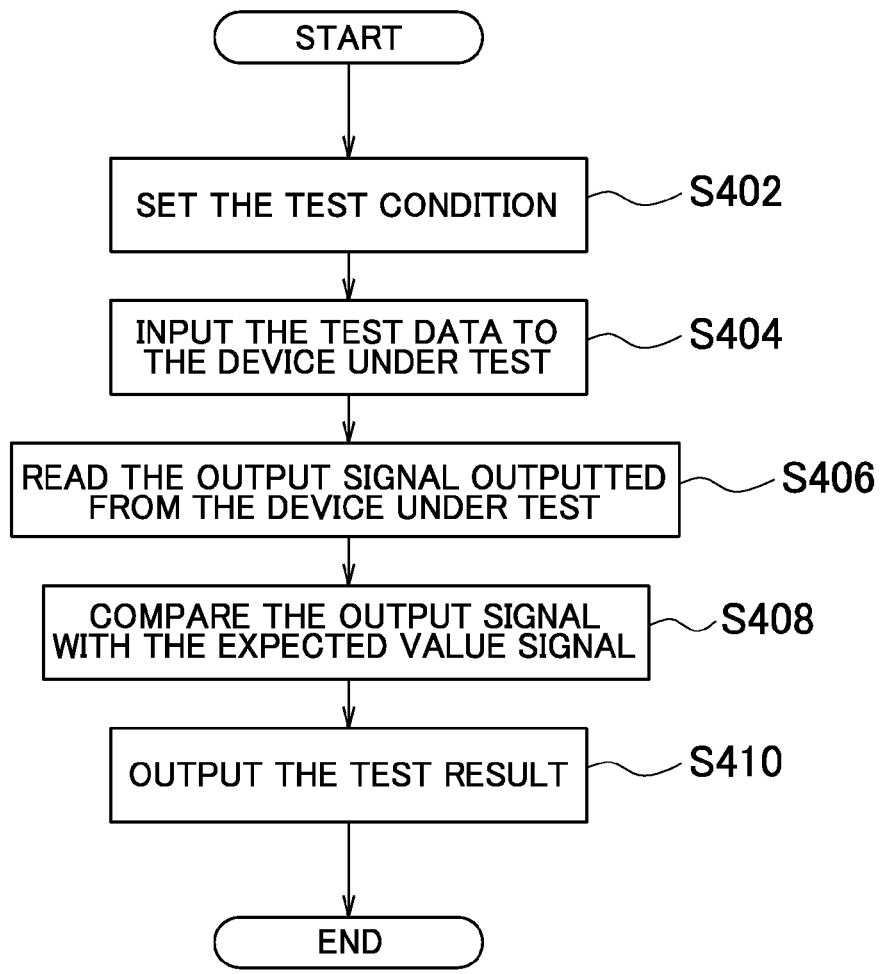
FIG. 4 schematically shows an exemplary test method adopted by the test apparatus 100.

FIG. 4 schematically shows an exemplary test method adopted by the test apparatus 100. FIG. 4 schematically shows an example of the test procedure in S302 of FIG. 3. First of all in S402, the test conditions are set. Exemplary test conditions are voltage, write pattern, and so on. In S404, the test data is inputted to the device under test 10. The test data can be inputted by the waveform shaping section 146 by writing an applied signal to the device under test 10. Next in S406, the logic comparing section 148 reads an output signal outputted from the device under test 10. In S408, the logic comparing section 148 compares the read output signal with the expected value signal supplied from the pattern generating section 142. In S410, when the output signal does not match the expected value signal, the logic comparing section 148 outputs the fail memory and supplies it to the fail memory 152. Then the test in S302 ends.

Figure 5:
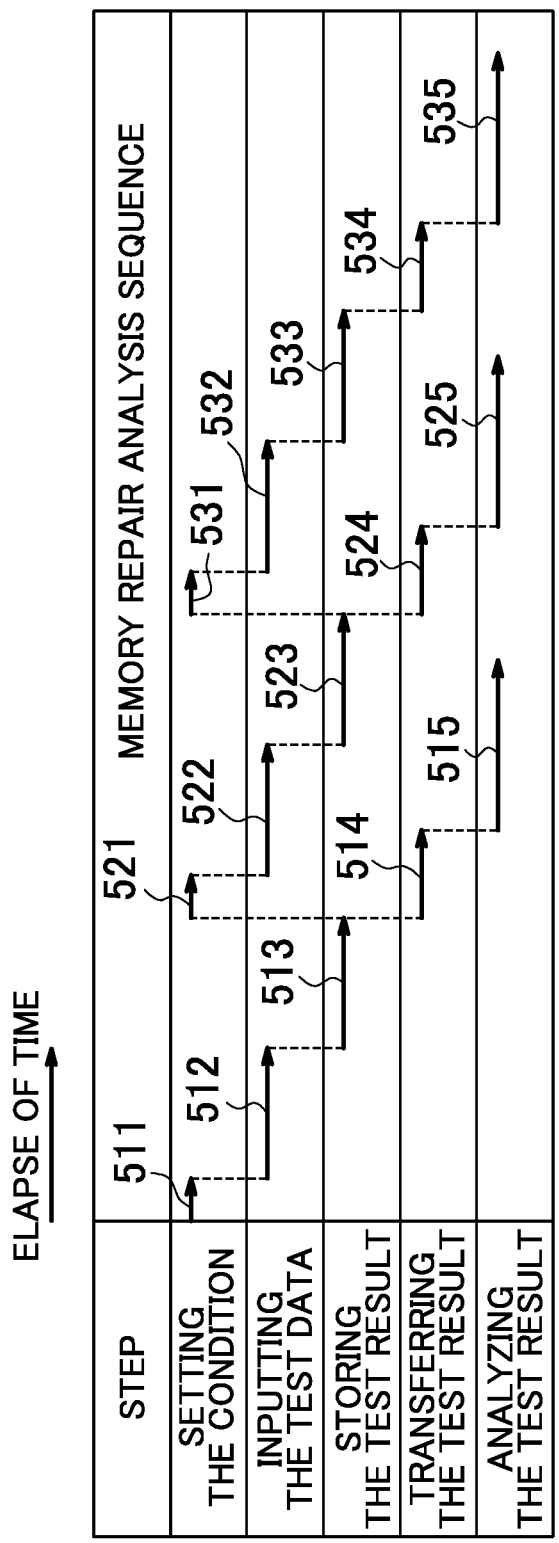
FIG. 5 schematically shows an exemplary time chart of the test apparatus 100.

FIG. 5 schematically shows an exemplary time chart of the test apparatus 100. FIG. 5 explains the memory repair analysis sequence of the test apparatus 100, by taking an example of changing the test conditions to execute a test 501, a test 502, and a test 503. The longitudinal axis of FIG. 5 shows an example of the test steps of the test apparatus 100. The lateral axis of FIG. 5 shows an elapse of time. As shown in the drawing, the test is executed in the order of a condition setting step (S402 of FIG. 4), a data inputting step (S404 of FIG. 4), a test storing step (S304 of FIG. 3), a transferring step (S306 of FIG. 3), and an analyzing step (S308 of FIG. 3). The test condition is then changed, and the above-mentioned steps are repeated sequentially.

Step 511 I FIG. 5 is the condition setting step of the test 501. Step 512 is the data inputting step of the test 501. Step 513 is the test storing step of the test 501. Step 514 is the transferring step of the test 501. Step 515 is the analyzing step of the test 501. Likewise, Step 521, Step 522, Step 523, Step 524, and Step 525 are the condition setting step, the data inputting step, the test storing step, the transferring step, and the analyzing step of the test 502. Step 531, Step 532, Step 533, Step 534, and Step 535 are the condition setting step, the data inputting step, the test storing step, the transferring step, and the analyzing step of the test 503.

As shown in FIG. 5, in the present embodiment, when the test storing step of the test 501 has ended, the transferring step of the test 501 starts, as well as starting the condition setting step of the test 502. Specifically, after ending of the data inputting step and the test storing step, the next test cycle begins, as well as multiplexing the data inputting step and the test storing step of the next cycle, with the transferring step and the analyzing step of the current test cycle. Accordingly, in the condition setting step and the data inputting step, the test throughput can be improved by making use of the advantage of not supplying fail data to the fail memory 152 from the logic comparing section 148. Here, it is desirable that the transferring step of the test 501 be ended prior to ending of the data inputting step of the test 502.

In other words, the fail memory 152 cannot conduct reading of the fail data supplied from the logic comparing section 148 and reading of the fail data to the buffer memory 154 at the same time. Here, the data processed in the data inputting step and the data processed in the transferring step are the same, and so the transferring step ends in a shorter time than the data inputting step. Moreover, even when transfer of the fail data takes longer as the increase in capacity of a device under test, the test throughput will not be adversely affected. In addition, by adopting the above-explained configuration, the wait time for the test executing section 140 in the transferring step can be made shorter. This helps improve the test throughput.

Note that by burst transferring a test result from the fail memory 152 to the buffer memory 154, the process time in the transferring step can be further reduced. This ensures that the process time of the transferring step be shorter than the process time of the data inputting step. In addition, use of a fail memory implementing the interleave technology also helps reduce the process time in the test storing step.

In the above description, a test method of a device under test for sequentially repeating a data inputting step of inputting test data to the device under test, a test storing step of testing the device under test based on the output from the device under test and storing the test result to a fail memory, a transferring step of transferring the test result stored in the fail memory to a buffer memory, and an analyzing step of analyzing the test result stored in the buffer memory. In this test method, after the data inputting step and the test storing step, the next test cycle starts, as well as multiplexing the data inputting step and the test storing step for the next test cycle, with the transferring step and the analyzing step.

Figure 6:
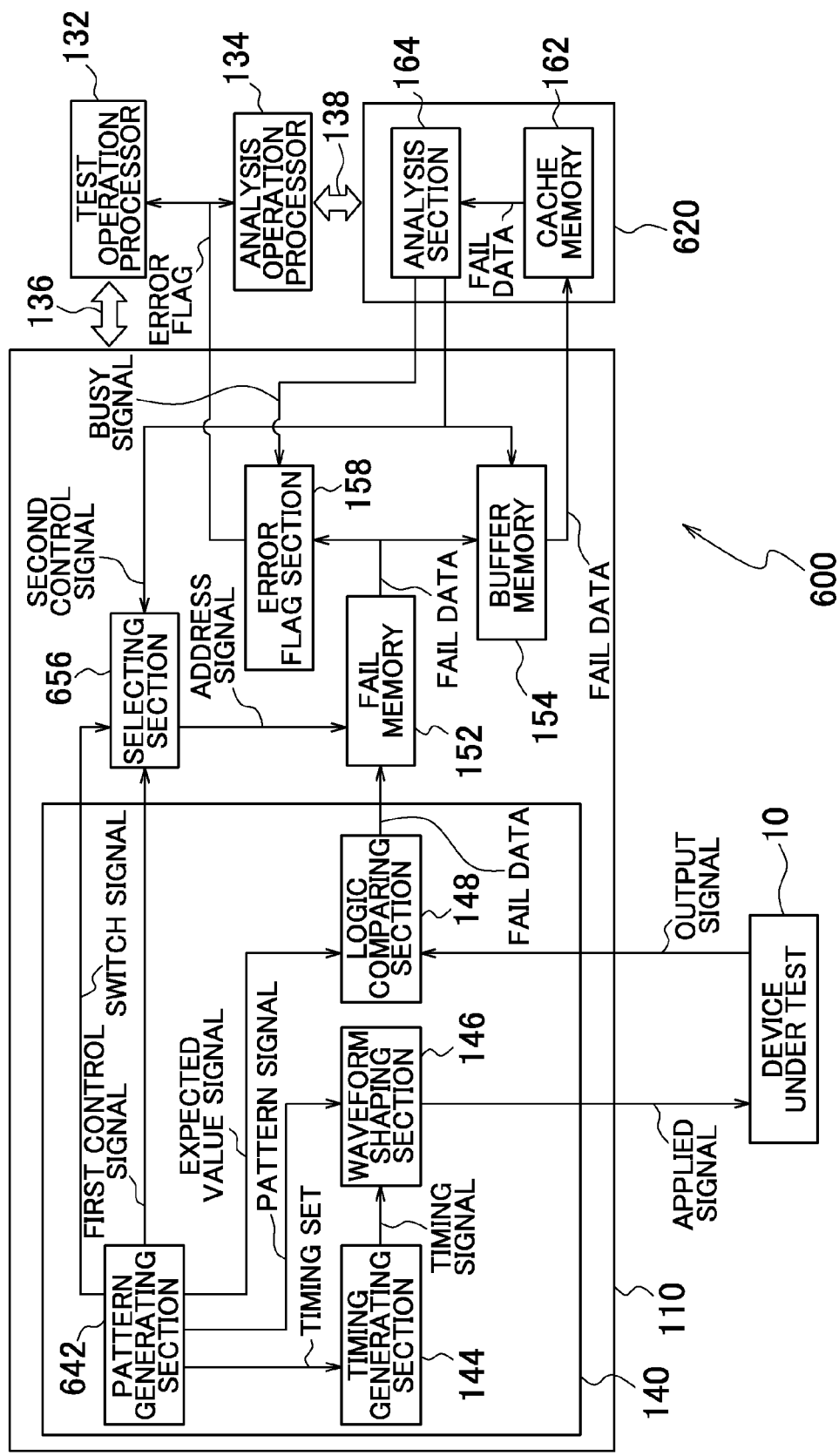
FIG. 6 schematically shows an exemplary configuration of a test apparatus 600 according to another embodiment of the present invention.

FIG. 6 schematically shows an exemplary configuration of a test apparatus 600 according to another embodiment of the present invention. The test apparatus 600 includes a pattern generating section 642 instead of the pattern generating section 142. The test apparatus 600 includes a selecting section 656 instead of the selecting section 156. The test apparatus 600 includes a memory repair analysis section 620 instead of the memory repair analysis section 120. Except for the above-stated differences, the test apparatus 600 includes the same configuration as the test apparatus 100.

The pattern generating section 642 is different from the pattern generating section 142, in generating a switch signal and supplying it to the selecting section 656. Except for this difference, the pattern generating section 642 has the same configuration as the pattern generating section 142. The switch signal defines which of the first control signal and the second control signal is selected as an address signal should be selected by the selecting section 656.

The switch signal may define that the selecting section 656 should select the first control signal the address signal The pattern generating section 642 may generate the switch signal and supply it to the selecting section 656 immediately before ending of the data inputting step. The switch signal may define that the selecting section 656 should select the second control signal as the address signal. The pattern generating section 642 may generate the switch signal and supply it to the selecting section 656 immediately before starting of the transferring step.

The selecting section 656 is different from the selecting section 156, in that the selecting section 656 is controlled by the switch signal supplied from the pattern generating section 642. Except for this difference, the selecting section 656 has the same configuration as the selecting section 156. The selecting section 656, when provided with a switch signal, may select the first control signal as the address signal. The selecting section 656 may be initialized in the condition setting stage, and select the second control signal as the address signal.

The memory repair analysis section 620 is different from the memory repair analysis section 120, in not supplying a busy signal to the selecting section 656. Except for this difference, the memory repair analysis section 620 has the same configuration as the memory repair analysis section 120.

Figure 7:
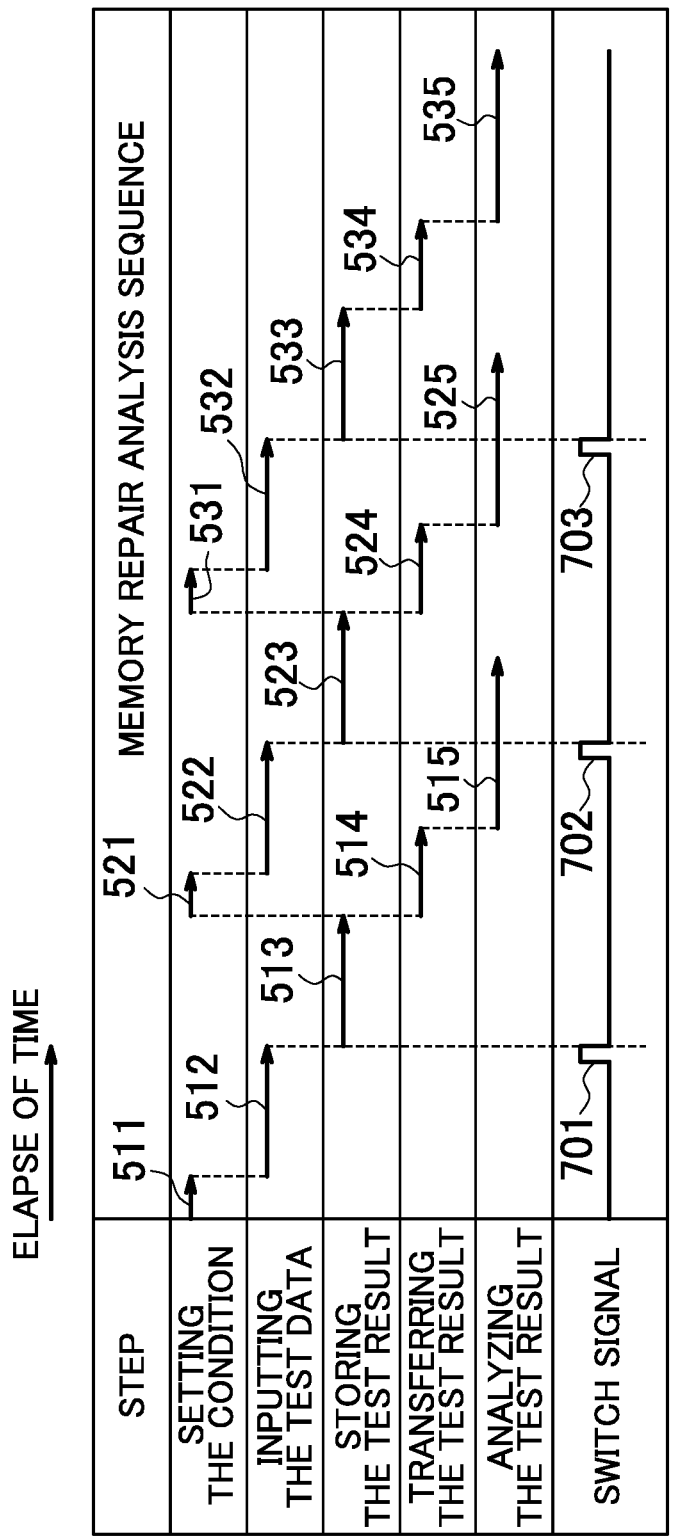
FIG. 7 schematically shows an exemplary time chart of the test apparatus 600.

FIG. 7 schematically shows an exemplary time chart of the test apparatus 600. FIG. 7 explains the memory repair analysis sequence of the test apparatus 600, by taking an example of changing the test conditions to execute a test 501, a test 502, and a test 503. The memory repair analysis sequence of the test apparatus 600 is different from the memory repair analysis sequence of the test apparatus 100, in having a time chart for a switch signal. Except for this difference, the memory repair analysis sequence of the test apparatus 600 has the similar time chart to the time chart of the memory repair analysis sequence of the test apparatus 100. As shown in FIG. 7, at the end of Step 512, the switch signal 701 is generated. Likewise, at the end of Step 522 and Step 532, the switch signal 702 and the switch signal 703 are respectively generated.

As shown in FIG. 7, the selecting section 656 in the present embodiment is initialized in Step 511. Accordingly, the selecting section 656 selects the second control signal as the address signal. The pattern generating section 642 generates a switch signal 701 and supplies it to the selecting section 656, immediately before ending of Step 512. Accordingly, the selecting section 656 selects the first control signal as the address signal. In the present example, Step 514 and Step 521 are multiplexed. Since the selecting section 656 is initialized in Step 521, the selecting section 656 selects the second control signal as the address signal in Step 514. Accordingly, the selecting section 656 can switch between the first control signal and the second control signal.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As clear from the above description, the test apparatus explained above can improve the test throughput.

What is claimed is:

1. A test apparatus for testing a device under test, comprising:
   a test executing section configured to execute a test on the device under test;
   a fail memory, coupled to the test execution section, configured to store a test result outputted by the test executing section, the fail memory implementing an interleave technology for interleaving accesses to a plurality of banks;
   a buffer memory, coupled to the fail memory, configured to store the test result transferred from the fail memory and transfers at least part of the test result to a cache memory, the buffer memory being either a memory not implementing the interleave technology or a memory implementing the interleave technology but having a smaller number of banks than the fail memory;
   the cache memory, coupled to the buffer memory, configured to store the at least part of the test result transferred from the buffer memory, the cache memory allowing random access in shorter time than the buffer memory does; and
   an analysis section, coupled to the cache memory, configured to analyze the test result stored in the cache memory.

2. The test apparatus according to claim 1, wherein
the device under test includes a redundant section, and
the analysis section determines a repair method to replace, with the redundant section, a failure section of the device under test that has not passed the test executed by the test executing section.

3. The test apparatus according to claim 2, wherein
the test result is burst transferred to the buffer memory from the fail memory.

4. The test apparatus according to claim 3, wherein
the test executing section generates a first control signal for controlling storage of the test result to the fail memory,
the analysis section generates a second control signal for controlling transfer of the test result from the fail memory to the buffer memory, and
the test apparatus further comprises:
a selecting section configured to select the first control signal or the second control signal, and is controlled by a busy signal indicating that the test result is being transferred from the fail memory to the buffer memory.

5. The test apparatus according to claim 4, further comprising:
an error flag section, during transfer of the test result from the fail memory to the buffer memory, if the test executing section has transmitted a new test result to the fail memory, is configured to store data indicating that the new test result has been transmitted.

6. The test apparatus according to claim 5, wherein
the device under test is a memory device, and
the analysis section determines a method to replace a failure row or a failure column including a failure memory cell, with an optimal redundant row or an optimal redundant column.

7. The test apparatus according to claim 3, wherein
the test executing section generates a first control signal for controlling storage of the test result in the fail memory,
the analysis section generates a second control signal for controlling transfer of the test result form the fail memory to the buffer memory, and
the test apparatus further comprises:
a selecting section configured to select the first control signal or the second control signal, and is controlled by a switch signal from the test executing section.

\* \* \* \* \*